US010332987B2

(12) United States Patent
Ning et al.

(10) Patent No.: US 10,332,987 B2
(45) Date of Patent: Jun. 25, 2019

(54) THIN FILM TRANSISTOR, MANUFACTURING METHOD FOR ARRAY SUBSTRATE, ARRAY SUBSTRATE AND DISPLAY DEVICE

(71) Applicant: BOE Technology Group Co., Ltd., Beijing (CN)

(72) Inventors: Ce Ning, Beijing (CN); Wei Yang, Beijing (CN); Hehe Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/554,446

(22) PCT Filed: Jan. 20, 2017

(86) PCT No.: PCT/CN2017/071930
§ 371 (c)(1),
(2) Date: Aug. 30, 2017

(87) PCT Pub. No.: WO2017/193637
PCT Pub. Date: Nov. 16, 2017

(65) Prior Publication Data
US 2018/0166562 A1   Jun. 14, 2018

(30) Foreign Application Priority Data
May 10, 2016 (CN) .......................... 2016 1 0304950

(51) Int. Cl.
*H01L 21/00* (2006.01)
*H01L 29/66* (2006.01)
(Continued)

(52) U.S. Cl.
CPC ...... *H01L 29/66969* (2013.01); *H01L 21/425* (2013.01); *H01L 21/426* (2013.01);
(Continued)

(58) Field of Classification Search
CPC .............. H01L 29/66969; H01L 21/44; H01L 29/78618; H01L 21/426; H01L 21/4757;
(Continued)

(56) References Cited

U.S. PATENT DOCUMENTS 9,012,914 B2 * 4/2015 Kishida ............... H01L 29/7869
257/58
9,263,625 B2 * 2/2016 Smith .................. H01L 31/1864
(Continued)

FOREIGN PATENT DOCUMENTS

CN   102224580 A   10/2011
CN   103367248 A   10/2013
(Continued)

OTHER PUBLICATIONS

Apr. 17, 2017—International Search Report and Written Opinion Appn PCT/CN2017/071930 with Eng Tran.
(Continued)

*Primary Examiner* — Vu A Vu
(74) *Attorney, Agent, or Firm* — Banner & Witcoff, Ltd.

(57) ABSTRACT

A thin film transistor, a manufacturing method for an array substrate, the array substrate, and a display device are provided. The manufacturing method for a thin film transistor includes: forming a semiconductor layer; performing a modification treatment on a surface layer of a region of the semiconductor layer, so that the region of the semiconductor layer has a portion in a first direction perpendicular to the semiconductor layer formed as an etching blocking layer, portions of the semiconductor layer on both sides of the etching blocking layer in a second direction parallel to a surface of the semiconductor layer remaining unmodified; and forming a source electrode and a drain electrode on the semiconductor layer, the source electrode and the drain electrode being formed on both sides of a center line of the
(Continued)

region perpendicular to the second direction, and spaced from each other in the second direction.

11 Claims, 4 Drawing Sheets

(51) Int. Cl.
  *H01L 21/77* (2017.01)
  *H01L 21/426* (2006.01)
  *H01L 21/44* (2006.01)
  *H01L 21/4757* (2006.01)
  *H01L 21/4763* (2006.01)
  *H01L 29/786* (2006.01)
  *H01L 21/465* (2006.01)
  *H01L 21/425* (2006.01)

(52) U.S. Cl.
  CPC ............ *H01L 21/44* (2013.01); *H01L 21/465* (2013.01); *H01L 21/4757* (2013.01); *H01L 21/47635* (2013.01); *H01L 21/77* (2013.01); *H01L 29/7869* (2013.01); *H01L 29/78606* (2013.01); *H01L 29/78618* (2013.01)

(58) Field of Classification Search
  CPC ........... H01L 29/78606; H01L 29/7869; H01L 21/47635
  USPC ........................................................ 438/104
  See application file for complete search history.

(56) References Cited

U.S. PATENT DOCUMENTS

| 2013/0285044 A1* | 10/2013 | Yuan .................... H01L 29/4908 257/43 |
| 2013/0320328 A1* | 12/2013 | Lee ...................... H01L 29/7869 257/43 |
| 2014/0084286 A1 | 3/2014 | Jeon et al. |
| 2016/0005870 A1 | 1/2016 | Huang et al. |

FOREIGN PATENT DOCUMENTS

| CN | 103500764 A | 1/2014 |
| CN | 103915508 A | 7/2014 |
| CN | 105702586 A | 6/2016 |
| CN | 105977205 A | 9/2016 |

OTHER PUBLICATIONS

Jan. 11, 2019—(CN) Second Office Action Appn 201610304950.2 with English Translation.

* cited by examiner

US 10,332,987 B2

THIN FILM TRANSISTOR, MANUFACTURING METHOD FOR ARRAY SUBSTRATE, ARRAY SUBSTRATE AND DISPLAY DEVICE

The application is a U.S. National Phase Entry of International Application No. PCT/CN2017/071930 filed on Jan. 20, 2017, designating the United States of America and claiming priority to Chinese Patent Application No. 201610304950.2 filed on May 10, 2016. The present application claims priority to and the benefit of the above-identified applications and the above-identified applications are incorporated by reference herein in their entirety.

TECHNICAL FIELD

The present disclosure relates to a thin film transistor, a manufacturing method for an array substrate, the array substrate, and a display device.

BACKGROUND

A metal oxide semiconductor transistor is a field-effect transistor that can be widely used in an analog circuit and a digital circuit. For example, the metal oxide semiconductor transistor may include a gate electrode, a source electrode and a drain electrode, as well as an active layer. The gate electrode, the source electrode and the drain electrode are made of, for example, a metal material. After forming a channel region, for example, a step of forming a metal electrode is included. The metal electrode is prepared, for example, by wet etching, so when the metal electrode is formed, a metal etching liquid may corrode a semiconductor material between the source electrode and the drain electrode, so as to further affect product performance.

SUMMARY

Embodiments of the present disclosure provide a thin film transistor, a manufacturing method for an array substrate, an array substrate and a display device. An etching method for the thin film transistor according to the embodiment of the present disclosure can effectively prevent corrosion by etching liquid, and improve product performance.

One aspect of the invention provides a manufacturing method for a thin film transistor, comprising: forming a semiconductor layer; performing a modification treatment on a surface layer of a region of the semiconductor layer, so that the region of the semiconductor layer has a portion in a first direction perpendicular to the semiconductor layer formed as an etching blocking layer, portions of the semiconductor layer on both sides of the etching blocking layer in a second direction parallel to a surface of the semiconductor layer remaining unmodified; and forming a source electrode and a drain electrode on the semiconductor layer, the source electrode and the drain electrode being formed on both sides of a center line of the region perpendicular to the second direction, and spaced from each other in the second direction.

In one embodiment, in the first direction, the source electrode and the drain electrode both partially overlap with the etching blocking layer, and both at least partially overlap with the portions outside the region of the semiconductor layer.

In one embodiment, the modification treatment includes ion injection.

In one embodiment, after the etching blocking layer is formed and before the source electrode and the drain electrode are formed, the semiconductor layer is patterned to form an active layer pattern.

In one embodiment, forming the etching blocking layer and forming the active layer pattern include: coating photoresist on the semiconductor layer, exposing and developing the photoresist with a gray-tone or half-tone mask, to form a photoresist pattern; the photoresist pattern including a photoresist completely-removed region, a first thickness region and a second thickness region, a thickness of the photoresist in the first thickness region being greater than a thickness of the photoresist of in second thickness region, the photoresist completely-removed region corresponding to a region where the etching blocking layer is to be formed, the photoresist completely-removed region and the first thickness region corresponding to a region where the active layer pattern is to be formed; performing ion injection on the semiconductor layer with the photoresist pattern as a mask, to form the etching blocking layer; performing ashing treatment on the photoresist pattern, to remove the photoresist in the second thickness region, and thin the photoresist in the first thickness region; etching the semiconductor layer, with the remaining photoresist in the first thickness region and the etching blocking layer as a mask, to form the active layer pattern; and removing the remaining photoresist in the first thickness region.

In one embodiment, the semiconductor layer has a material of a metal oxide semiconductor.

In one embodiment, a material for forming the semiconductor layer includes at least one of IGZO, ZnO, or IZO.

In one embodiment, the modification treatment includes injecting at least one of tin ion or titanium ion into the semiconductor layer.

In one embodiment, a material for forming the source electrode and the drain electrode includes at least one of copper, aluminum, or molybdenum.

In one embodiment, after the etching blocking layer is formed, the manufacturing method comprises performing a plasma treatment on the etching blocking layer.

In one embodiment, the plasma used in the plasma treatment includes plasma formed by nitrous oxide or oxygen.

Another aspect of the disclosure provides a manufacturing method for an array substrate, comprising: providing a base substrate; forming a thin film transistor on the base substrate; the thin film transistor being manufactured by using the manufacturing method for a thin film transistor as mentioned above.

Another aspect of the disclosure provides an array substrate, comprising: a base substrate; a thin film transistor provided on the base substrate, wherein, the thin film transistor includes an active layer and an etching blocking layer, at least a portion of the etching blocking layer being embedded into the active layer.

In one embodiment, a surface of the etching blocking layer is flush with a surface of the active layer.

In one embodiment, the array substrate further comprises a source-drain metal layer pattern, the source-drain metal layer pattern including a source electrode and a drain electrode of the thin film transistor; the source electrode and the drain electrode both partially overlap with the etching blocking layer in a first direction perpendicular to the base substrate, and are spaced from each other in a second direction parallel to the base substrate.

In one embodiment, a size of an overlapping portion between the etching blocking layer and at least one of the source electrode or the drain electrode in the second direction is greater than 1 μm.

In one embodiment, a size of an overlapping portion between the etching blocking layer and at least one of the source electrode or the drain electrode in the second direction is within a range of 2 μm to 4 μm.

In one embodiment, a material of the active layer includes a metal oxide semiconductor; the etching blocking layer includes a compound in which at least one of tin ion or titanium ion is doped in the metal oxide semiconductor.

In one embodiment, a material of the active layer includes at least one of IGZO, ZnO, or IZO.

In one embodiment, a thickness of the etching blocking layer is greater than or equal to 3 nm.

In one embodiment, the thickness of the etching blocking layer is within a range of 5 nm to 15 nm.

Another aspect of the invention provides a display device, comprising the array substrate as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
FIG. 1a to FIG. 1d are schematic diagrams of a manufacturing process of a thin film transistor according to an embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A semiconductor layer of a thin film transistor can be prepared, for example, by amorphous silicon (a-Si) and polysilicon. The semiconductor layers made of amorphous silicon and polysilicon have their own advantages and disadvantages.

Amorphous silicon (a-Si) is easy to be prepared in a large area at a low temperature, by using a mature technology, so it is widely used in preparation of semiconductor devices. An a-Si material has a band gap of only 1.7 v, which is opaque to visible light, and has photosensitivity in a range of visible light. When a display device is prepared, in order to prevent performance of a semiconductor material from being affected, it is usually necessary to provide a black matrix for shielding. By providing the black matrix to shield light, complexity of a process of preparing a liquid crystal display is increased, costs are increased, and reliability and an aperture ratio are reduced.

Polysilicon has excellent performance, but its manufacturing process is complicated with a high cost, and is also opaque in a visible light band. In addition, mobility of a hydrogenated amorphous silicon semiconductor is difficult to exceed 1 $cm^2 \cdot v^{-1} \cdot s^{-1}$. At present, a technology of preparing the thin film transistor by using hydrogenated amorphous silicon has been matured, and it is difficult to obtain breakthrough improvement any more.

A metal oxide semiconductor transistor (i.e., the thin film transistor, hereinafter briefly referred to as the thin film transistor) is a field-effect transistor which may be widely used in an analog circuit and a digital circuit. In a manufacturing process of the thin film transistor, for example, after the semiconductor layer is formed, a step of forming a metal electrode is further included. For example, the metal electrode may be prepared by a wet process. Typically, a metal etching liquid used in wet etching will corrode the semiconductor material of a metal oxide semiconductor layer, so as to affect performance of the thin film transistor.

One aspect of the present disclosure provides a manufacturing method for a thin film transistor, comprising: forming a semiconductor layer; modifying a surface layer of a region of the semiconductor layer, so that the region of the semiconductor layer has a portion in a first direction perpendicular to the semiconductor layer formed as an etching blocking layer, portions of the semiconductor layer on both sides of the etching blocking layer in a second direction parallel to a surface of the semiconductor layer remaining unmodified; and forming a source electrode and a drain electrode on the semiconductor layer, the source electrode and the drain electrode being formed on both sides of a center line of the region perpendicular to the second direction, and spaced from each other in the second direction. In the embodiment of the present disclosure, the etching blocking layer is formed by modifying the metal oxide semiconductor layer, which simplifies the process, and at the same time, avoids a drawback caused by introduction and formation of a new material layer in order to form the etching blocking layer.

It should be noted that, in the manufacturing method for a thin film transistor, the semiconductor layer is formed firstly, and then a portion of a surface of the semiconductor is processed. For example, in such a surface modification mode, a portion of the semiconductor layer in the first direction perpendicular to the semiconductor layer can be formed into the etching blocking layer. For example, the modified portion of the semiconductor layer includes a portion of the surface and a portion embedded from the portion of the surface into the semiconductor layer. In the second direction parallel to the semiconductor layer, both sides of the etching blocking layer include unmodified portions. The source-drain electrodes are formed on the semiconductor layer, and the source-drain electrodes are formed, for example, on both sides of the modified region. For example, the source-drain electrodes may also partially overlap with the etching blocking layer, and the source-drain electrodes are spaced from each other in the second direction. The source-drain electrodes are formed, for example, by firstly depositing a layer of metal thin film, and then etching away redundant metal with a metal etching liquid, leaving the source electrode and the drain electrode. For example, the above-described etching blocking layer according to the embodiment of the present disclosure may completely cover a channel region, so as to effectively prevent the etching liquid from corroding the semiconductor layer when etching the source and drain electrodes by using the etching liquid. Of course, the etching blocking layer may also only partially cover the channel region, which is not limited in the present disclosure.

Figure 1B:
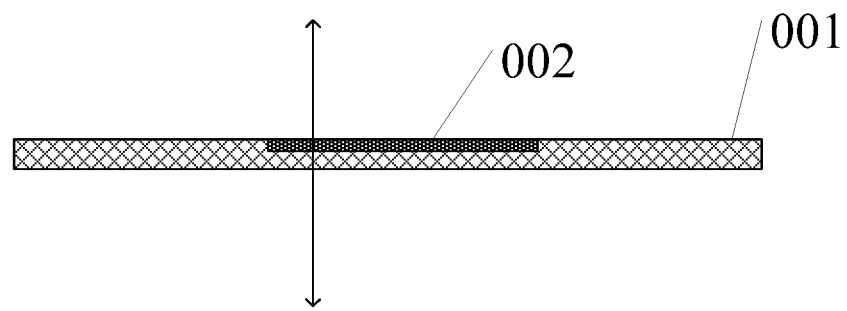
Figure 1C:
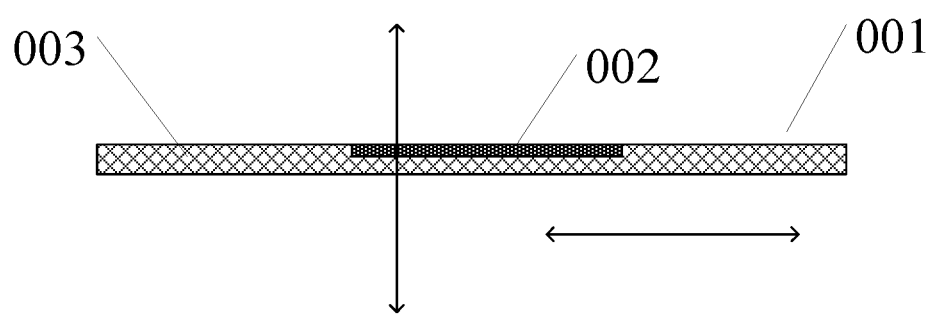
Figure 1D:
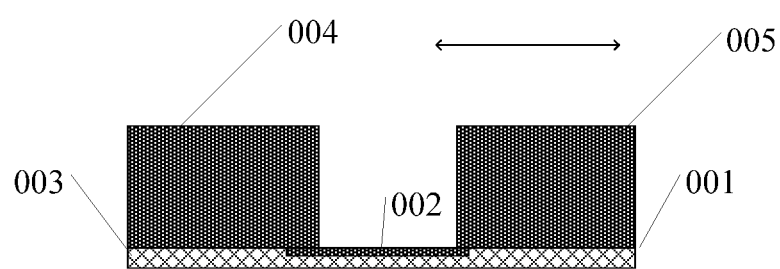

FIG. 1a to FIG. 1d are schematic diagrams of preparation of the thin film transistor according to the embodiment of the present disclosure. With reference to FIG. 1a, firstly a semiconductor layer 001 is formed. With reference to FIG. 1b, a portion of a surface of the semiconductor layer 001 is modified, so that the portion of the surface has a portion in a first direction (a direction indicated by a vertical arrow in FIG. 1b) formed as an etching blocking layer 002. With reference to FIG. 1c, the etching blocking layer 002 includes unmodified portions 003 on both sides in a second direction (a direction indicated by a horizontal arrow in FIG. 1c) parallel to a plane of the semiconductor layer 001. With reference to FIG. 1d, a source electrode 004 and a drain electrode 005 are formed on the semiconductor layer 001, and the source electrode 004 and the drain electrode 005 are spaced from each other in the second direction.

In one embodiment, the source electrode and the drain electrode both partially overlap with the etching blocking layer, and both at least partially overlap with portions outside the region of the semiconductor layer. With reference to FIG. 1d, for example, the etching blocking layer 02 includes portions overlapping with the source electrode 004 and the drain electrode 005, to better prevent the metal etching liquid from corroding the semiconductor layer 001. For example, the etching blocking layer may also overlap with only one of the source electrode and the drain electrode. Other varied structures on this basis, all belong to the protection scope of the present disclosure.

In addition, with further reference to FIG. 1d, both the source electrode 004 and the drain electrode 005 should include a portion overlapping with the portion outside the modified region of the semiconductor layer 001, so that the metal electrode is brought into direct contact with the semiconductor layer.

For example, the semiconductor layer is made of a metal oxide semiconductor. For example, a metal oxide semiconductor material includes at least one of IGZO, ZnO, or IZO.

In one embodiment, the modification treatment is ion injection. For example, an ion used in ion injection is a tin ion or a titanium ion. For example, the tin ion and the titanium ion may be used at the same time. After the tin ion or the titanium ion is injected into the above-described region of the semiconductor layer, for example, a new compound or composition may be formed with a metal oxide in the semiconductor layer, so that the region can block the corrosion of the metal etching liquid. In addition, in the embodiment of the present disclosure, the etching blocking layer is formed by modifying the metal oxide semiconductor layer, which simplifies the process, and at the same time, avoids a drawback caused by introduction and formation of a new material layer in order to form the etching blocking layer.

In one embodiment, after the etching blocking layer is formed and before the source electrode and the drain electrode are formed, the semiconductor layer is patterned to form an active layer pattern.

In one embodiment, an active layer pattern may be formed by using a gray-tone or half-tone exposure technology. FIG. 2a to FIG. 2e are schematic diagrams of preparing the thin film transistor by using a semi-exposure technology according to the embodiment of the present disclosure. For example, the forming the etching blocking layer and the forming the active layer pattern may include the following steps.

Figure 2A:
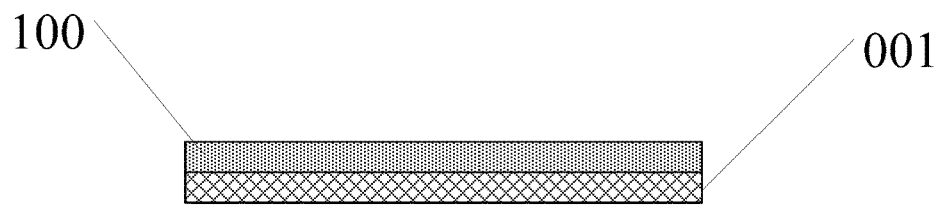
FIG. 2a to FIG. 2f are schematic diagrams of a process of forming an active layer pattern by using a semi-exposure technology according to an embodiment of the present disclosure.
Figure 2B:
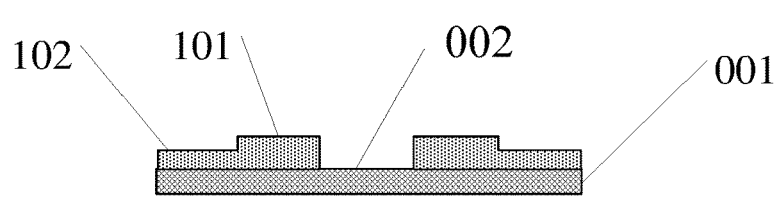

With reference to FIG. 2a, firstly, photoresist 100 is coated on the semiconductor layer 001, the photoresist 100 is exposed and developed with a gray-tone or half-tone mask, to form a photoresist pattern. With reference to FIG. 2b, the photoresist pattern includes a photoresist completely-removed region, a first thickness region 101 and a second thickness region 102, a thickness of photoresist in the first thickness region 101 being greater than a thickness of photoresist in the second thickness region 102, the photoresist completely-removed region corresponds to a region where the etching blocking layer 002 is to be formed, the photoresist completely-removed region and the first thickness region 101 correspond to a region where the active layer pattern is to be formed.

Figure 2C:
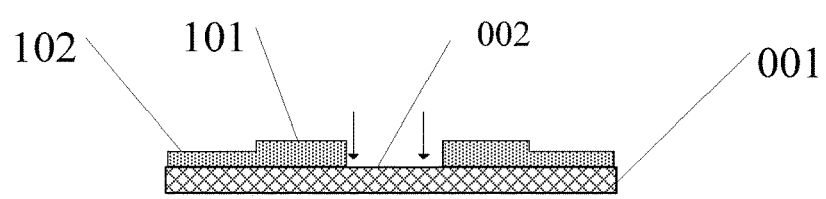

With reference to FIG. 2c, ion injection is performed on the semiconductor layer 001 with the photoresist pattern as a mask, to form the etching blocking layer 002.

Figure 2D:
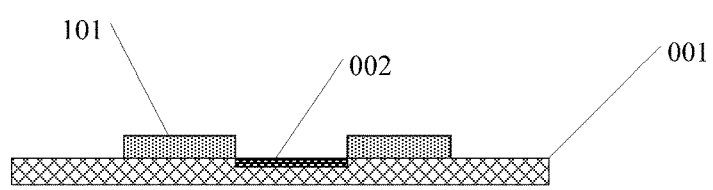

Ashing treatment is performed on the photoresist pattern, to remove the photoresist in the second thickness region 102, and thin the photoresist in the first thickness region 101; with reference to FIG. 2c, the photoresist subjected to the ashing treatment only has the first thickness region 101 left, and has its thickness reduced in the ashing process. With reference to FIG. 2d, the photoresist in the second thickness region 102 has been removed.

Figure 2E:
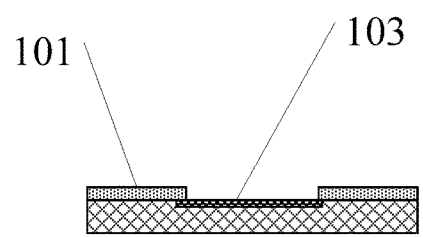

With remaining photoresist in the first thickness region 101 and the etching blocking layer 002 as a mask, etching is performed on the semiconductor layer 001 (i.e., an active layer protected by no photoresist in FIG. 2d), and the portion of the active layer is removed. With reference to FIG. 2e, the portion of the active layer 001 exposed out of the photoresist has been etched away, and at this time, the photoresist in the first thickness region 101 still exists.

Figure 2F:
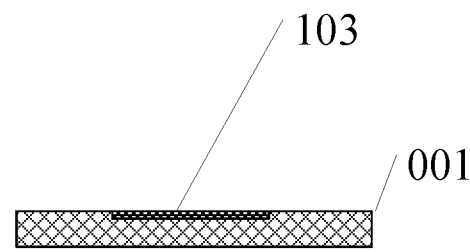

The remaining photoresist in the first thickness region 101 is removed, to form the active layer pattern, as shown in FIG. 2f.

In this embodiment, by using the half-tone or gray-tone mask exposure technology, the etching blocking layer and the active layer pattern are formed by single masking, which improves production efficiency and reduces costs. In addition, in the embodiment of the present disclosure, the etching blocking layer is formed by modifying the metal oxide semiconductor layer, which simplifies the process, and at the same time, avoids a drawback caused by introduction and formation of a new material layer in order to form the etching blocking layer.

In one embodiment, an active layer pattern is made of a metal oxide semiconductor. For example, a metal oxide material may include one or more of IGZO, ZnO and IZO.

In one embodiment, for example, the modification treatment is injecting a tin ion or a titanium ion into the semiconductor layer. Ion injection is performed on the semiconductor layer by using at least one of the tin ion or the titanium ion, which may enable the formed etching blocking layer to have a better corrosion resistant effect.

In one embodiment, the source electrode and the drain electrode are made of copper, aluminum or molybdenum.

In one embodiment, after the etching blocking layer is formed, the manufacturing method comprises performing plasma treatment on the etching blocking layer. For example, the plasma used may be a plasma formed by nitrous oxide or oxygen. For example, in the method, after the etching blocking layer is formed, the etching blocking layer may be placed in a plasma environment, so as to ensure performance of the etching blocking layer during the process. For example, annealing treatment may be further performed on the etching blocking layer, so as to further improve the performance of the etching blocking layer.

It should be noted that, forming the thin film transistor further includes forming a gate electrode, a gate insulating layer, and the like. For example, with respect to a thin film transistor having a bottom gate structure, before the semiconductor layer is formed, firstly, the gate electrode and the gate insulating layer are formed, then the semiconductor layer is formed on the gate insulating layer, and the source electrode and the drain electrode are formed on the semiconductor layer. With respect to a thin film transistor having a top gate structure, firstly, the semiconductor layer is formed, the source electrode and the drain electrode are formed on the semiconductor layer, then a metal electrode is formed on the semiconductor layer, and the gate insulating layer and the gate electrode are formed on the metal electrode. The gate electrode is made of, for example, a metal material, which includes, for example, at least one of copper, aluminum, or molybdenum.

Another aspect of the present disclosure provides a manufacturing method for an array substrate, comprising: providing a base substrate; and forming a thin film transistor on the base substrate; the thin film transistor being prepared by using the manufacturing method for a thin film transistor as described above.

It should be noted that, when forming an array substrate having a bottom gate structure, the forming an array substrate comprises, for example: depositing a gate metal layer, forming a gate line and a gate electrode; depositing a gate insulating layer; depositing an active layer pattern, and forming an active layer pattern including an etching blocking layer in the manner as described above; and forming a source-drain metal layer, a planarization layer, a via hole and other steps.

Hereinafter, an embodiment of manufacturing steps of an array substrate is given below; however, the embodiments of the present disclosure are not limited thereto:

Step (1): depositing a metal layer on a substrate. Patterning of a gate electrode and a gate line is accomplished by using a single patterning process.

Step (2): depositing an insulating layer, a metal oxide semiconductor thin film. For example, the metal oxide semiconductor thin film is preferably indium gallium oxide (IGZO), and may also be a material such as zinc oxide (ZnO) or indium zinc oxide (IZO). An active layer pattern is formed by using a single patterning process, and ion injection treatment is performed on a partial region of the active layer pattern, to form an oxide etching blocking layer. For example, a tin ion or a titanium ion may be used in ion injection.

In some examples: photoresist is coated, and the photoresist is exposed with a gray-tone or half-tone mask, to form a photoresist removed region, a first thickness region and a second thickness region, a thickness of the first thickness region is greater than a thickness of the second thickness region, the first thickness region and the photoresist removed region correspond to the active layer pattern; the photoresist removed region is removed by exposure, and the exposed active layer is subjected to ion injection treatment, to form an etching blocking layer. Then ashing is performed on the photoresist, to remove the second thickness region, and reduce the thickness of the first thickness region, the active layer is etched with an etching liquid, to remove a portion of the active layer corresponding to the second thickness region of the above-described photoresist; the remaining photoresist is etched away, to obtain the active layer pattern including the etching blocking layer.

Step (3): depositing a source-drain metal layer, accomplishing a data line and source-drain electrodes by using a single patterning process. For example, the metal may be copper, aluminum, molybdenum, and the like.

For example, the source-drain electrodes are deposited by magnetron sputtering. As described above, the source-drain electrodes can partially cover the blocking layer, to prevent the etching liquid from etching the active layer.

Step (4): depositing a protective layer.

For example, in order to ensure performance of the etching blocking layer formed, before the protective layer is deposited, the etching blocking layer may be treated with a plasma formed by nitrogen dioxide or oxygen. For example, annealing treatment may be further performed on the etching blocking layer.

In the above-described steps, for example, steps of accomplishing a via hole pattern by using a single patterning process; as well as depositing a transparent conductive thin film, and forming a pixel electrode pattern by using a single patterning process are included.

In the embodiment of the present disclosure, the etching blocking layer is formed by modifying the metal oxide semiconductor layer, which simplifies the process, and at the same time, avoids a drawback caused by introduction and formation of a new material layer in order to form the etching blocking layer, and improves performance of the array substrate.

A further aspect of the present disclosure provides an array substrate, comprising: a base substrate; a thin film transistor provided on the base substrate, wherein, the thin film transistor includes an active layer and an etching blocking layer, at least a portion of the etching blocking layer being embedded into the active layer.

In the array substrate according to the embodiment of the present disclosure, since the active layer includes the etching blocking layer, the metal etching liquid may be prevented from corroding the active layer, to improve product performance.

It should be noted that, the array substrate may have a plurality of thin film transistors, and all the plurality of thin film transistors may include the etching blocking layer as described above, or some of the thin film transistor may include the above-described etching blocking layer. In addition, at least a portion of the etching blocking layer is embedded into the active layer. For example, the etching blocking layer is obtained by modifying a portion of a surface of the active layer (e.g., by ion injection). In this case, a side of the etching blocking layer is smoothly transitioned to an unmodified portion of the active layer, and the other side is completely embedded into the interior of the active layer. For example, the etching blocking layer may include the portion of the surface modified, and may also include a portion covering the surface of the active layer. In this case, the blocking layer into the interior of the active layer and the portion covering the surface thereof. These obvious variations and modifications all belong to the protection scope of the present disclosure.

Figure 3A:
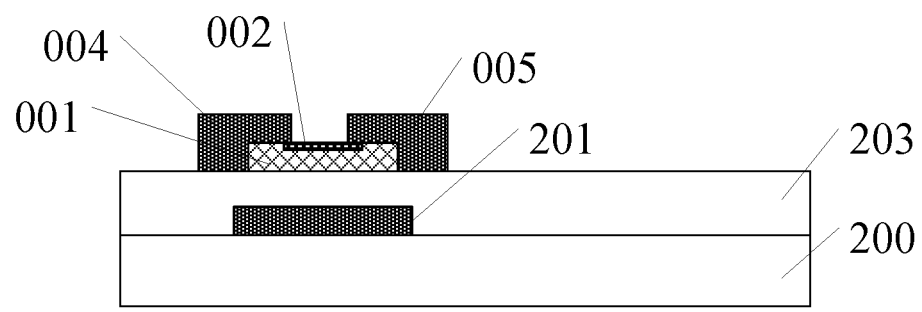
FIG. 3a is a cross-sectional schematic diagram of an array substrate according to an embodiment of the present disclosure.

FIG. 3a is a cross-sectional schematic diagram of the array substrate according to the embodiment of the present disclosure. With reference to FIG. 3a, the array substrate comprises a base substrate 200, and a gate metal layer pattern provided on the base substrate 200. The gate metal layer pattern includes a gate electrode 201, and a gate insulating layer 203 provided on the gate metal layer pattern. The array substrate further comprises an active layer pattern. An etching blocking layer 002 is formed on a surface of partial region of the active layer pattern. At a position corresponding to the gate electrode, a source electrode 004 and a drain electrode 005 of a thin film transistor are further included. The active layer includes a channel region, for example, the active layer includes an etching blocking layer 002 at least in a position of the channel region. By modifying a portion of the surface of the active layer, to obtain the etching blocking layer, it is possible to prevent the metal etching liquid from corroding the active layer, and further improve performance of the thin film transistor.

Figure 3B:
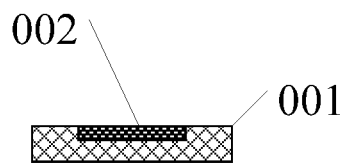
FIG. 3b is a schematic diagram of an active layer structure including an etching blocking layer in the array substrate according to the embodiment of the present disclosure.

In one embodiment, a surface of the etching blocking layer is flush with the surface of the active layer. With reference to FIG. 3b, the surface of the etching blocking layer 002 is flush with the surface of the active layer 001. For example, in a case where the etching blocking layer is obtained by modifying a portion of the surface of the active layer (for example, by ion injection), the surface of the etching blocking layer is flush with other portion of the active layer. That is to say, in the modification mode, merely a portion of the active layer is modified into the etching blocking layer, but its thickness and shape remain substantially unchanged. In the modification mode, the etching blocking layer formed has a stable structure, which further prevent the metal etching liquid from corroding the active layer more effectively. In the embodiment of the present disclosure, the etching blocking layer is formed by modifying the metal oxide semiconductor layer, which simplifies the process, and at the same time, avoids a drawback caused by introduction and formation of a new material layer in order to form the etching blocking layer.

Figure 3C:
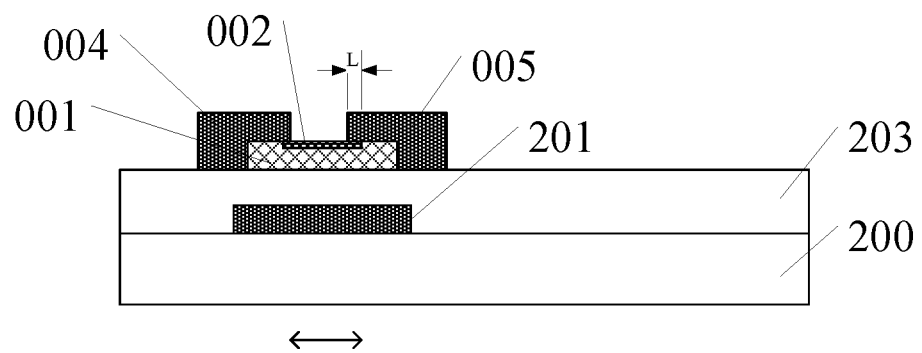
FIG. 3c is a schematic diagram of an overlapping portion of source-drain electrodes and the etching blocking layer in the array substrate according to the embodiment of the present disclosure.

In one embodiment, with reference to FIG. 3c, the array substrate further comprises a source-drain metal layer pattern, the source-drain metal layer pattern including a source electrode 004 and a drain electrode 005 of a thin film transistor. For example, as shown in FIG. 3c, the source electrode 004 and the drain electrode 005 partially overlap with the etching blocking layer 002. Since a property of the etching blocking layer 002 is different from a property of the unmodified active layer 001, the source electrode 004 and the drain electrode 005 of the thin film transistor merely partially overlap with the etching blocking layer 002. That is to say, both the source electrode 004 and the drain electrode 005 of the thin film transistor also include a portion that coincides with the unmodified portion of the active layer 001, to avoid affecting performance of the thin film transistor. At the same time, both the source electrode 004 and the drain electrode 005 partially overlap with the etching blocking layer 002, for example, the etching blocking layer 002 completely covers the channel region, so as to prevent the metal etching liquid from flowing between the channel region and the metal electrode into the active layer. That is to say, there may be no unmodified portion between the channel region and the metal electrode of the thin film transistor, so as to further improve performance of the thin film transistor.

In one embodiment, an overlapping distance between the etching blocking layer and at least one of the source electrode or the drain electrode in a direction in which the source-drain electrodes face each other (i.e., in a direction parallel to a plane of the base substrate in which the source electrode and the drain electrode are spaced from each other) is greater than 1 μm. With reference to FIG. 3c, as described above, the etching blocking layer 002 covers the channel region of the thin film transistor; besides, it may further include a portion overlapping with the source electrode 004 and the drain electrode 005. That is, in a direction in which the source electrode 004 and the drain electrode 005 of the thin film transistor face each other (i.e., a direction indicated by an arrow in FIG. 3c), the etching blocking layer 002 has an overlapping portion with at least one of the source electrode 004 or the drain electrode 005. For example, as shown in FIG. 3c, the etching blocking layer 002 has an overlapping portion with both the source electrode 004 and the drain electrode 005. For example, as shown in FIG. 3c, in the direction in which the source electrode 004 and the drain electrode 005 face each other, the etching blocking layer 002 has an overlapping portion with both the source electrode 004 and the drain electrode 005, and there is no unmodified portion in the channel region between the source electrode and the drain electrode. The etching blocking layer overlaps with the source electrode and the drain electrode, so it is possible to effectively prevent the metal etching liquid from corroding the active layer, and improve performance of the thin film transistor.

By limiting an overlapping distance between the etching blocking layer and the source-drain electrodes, it is possible to improve a corrosion resistant effect. With further reference to FIG. 3c, for example, an overlapping distance L between the etching blocking layer and at least one of the source electrode 004 or the drain electrode 005, in the direction in which the source-drain electrodes face each other (i.e., the direction indicated by the arrow in FIG. 3c) is within a range of 2 μm to 4 μm. By further limiting the overlapping distance between the etching blocking layer and the source-drain electrodes, it is possible to prevent the etching liquid from corroding the active layer more effectively.

In one embodiment, the active layer is made of a metal oxide semiconductor; and the etching blocking layer is a compound in which at least one of tin ion or titanium ion is doped in the metal oxide semiconductor. By doping at least one of the tin ion or the titanium ion in the metal semiconductor oxide, the etching blocking layer may be formed, which further effectively prevents the metal etching liquid from corroding the active layer.

For example, the active layer is made of a zinc oxide; and for example, the metal oxide material may include one or more of IGZO, ZnO and IZO. The etching blocking layer is a compound in which at least one of the tin ion or the titanium ion is doped in the zinc oxide. By doping at least one of the tin ion or the titanium ion in these materials, it is possible to effectively prevent the metal etching liquid from corroding the active layer, under a premise of convenient etching.

Figure 3D:
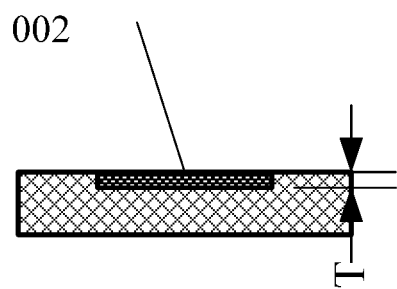
FIG. 3d is a schematic diagram of a thickness of the etching blocking layer in the array substrate according to the embodiment of the present disclosure.

In one embodiment, a thickness of the etching blocking layer is greater than or equal to 3 nm. The thickness of the etching blocking layer, on the one hand, depends on a thickness of the active layer, and is smaller than the thickness of the active layer in the region, and on the other hand, depends on an ion injection process. From a viewpoint of preventing the metal etching liquid from corroding the active layer, the larger the thickness of the etching blocking layer, the better. From a viewpoint of steps and costs of the ion injection process, the smaller the thickness of the etching blocking layer, the better. However, it is a premise that the etching blocking layer can effectively prevent the metal etching liquid from corroding. With reference to FIG. 3d, a thickness T of the etching blocking layer 002 is greater than or equal to 3 nm. Thus, it is possible to effectively prevent the active layer from being corroded by the metal etching liquid.

In this embodiment, for example, the thickness of the etching blocking layer is within a range of 5 nm to 15 nm. Thus, it is possible to prevent the metal etching liquid from corroding the active layer more effectively.

Still another aspect of the present disclosure provides a display device comprising the above-described array substrate. An active layer of the array substrate in the display device is provided with an etching blocking layer, so as to prevent the metal etching liquid from corroding the active layer, in a manufacturing process of the array substrate, which improves performance of the array substrate, and further improves performance of the display device.

In this text, terms such as "first" and "second" are only used for differentiating one entity or operation from another entity or operation without requiring or implying that these entities or operations have any such actual relationship or sequence. Terms "comprise", "include" or other variants are open-ended expression, which does not exclude processes, methods and articles included therein, and presence of other elements. It should be explained that directional or positional relationships shown by terms such as "upper", "lower" are directional or positional relationships shown as in the drawings, which only means to facilitate description of the present disclosure and simplify the description, but do not indicate or imply that the devices or components must have specific directions, or be constructed or operated in the specific directions, and are not limitative of the present disclosure. Unless expressly stipulated or defined, terms "mounted", "connected" and "linked" should be broadly understood, for example, they may be fixedly connected, detachably connected, or integrally connected; may be mechanically connected or electrically connected; or may be directly connected, indirectly connected by a medium, or internally communicated between two components. For those ordinarily skilled in the art, the specific meanings of the terms in the present disclosure can be understood according to specific conditions.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201610304950.2 filed on May 10, 2016, the present disclosure of which is incorporated herein by reference in its entirety as part of the present application.

The invention claimed is:

1. A manufacturing method for a thin film transistor, comprising:
    before forming an etching blocking layer, forming a semiconductor layer;
    performing a modification treatment on a surface layer of a region of the semiconductor layer, so that the region of the semiconductor layer has a portion in a first direction perpendicular to the semiconductor layer formed as the etching blocking layer, wherein portions of the semiconductor layer on both sides of the etching blocking layer in a second direction parallel to a surface of the semiconductor layer remain unmodified; and
    forming a source electrode and a drain electrode on the semiconductor layer, wherein the source electrode and the drain electrode are formed on both sides of a center line of the region perpendicular to the second direction, and spaced from each other in the second direction,
    wherein in the first direction, the source electrode and the drain electrode both partially overlap with the etching blocking layer, and both at least partially overlap with the portions of the semiconductor layer on both sides of the etching blocking layer.

2. The manufacturing method for the thin film transistor according to claim 1, wherein, the modification treatment includes ion injection.

3. The manufacturing method for the thin film transistor according to claim 1, wherein, after the etching blocking layer is formed and before the source electrode and the drain electrode are formed, patterning the semiconductor layer to form an active layer pattern.

4. The manufacturing method for the thin film transistor according to claim 3, wherein, the performing the modification treatment comprises:
    coating photoresist on the semiconductor layer, exposing and developing the photoresist with a gray-tone or half-tone mask to form a photoresist pattern; the photoresist pattern including a photoresist completely-removed region, a first thickness region, and a second thickness region, a thickness of the photoresist in the first thickness region being greater than a thickness of the photoresist in the second thickness region, the photoresist completely-removed region corresponding to a region where the etching blocking layer is to be formed, the photoresist completely-removed region and the first thickness region corresponding to a region where the active layer pattern is to be formed; and
    performing ion injection on the semiconductor layer, with the photoresist pattern as a mask, to form the etching blocking layer,
    and wherein the patterning the semiconductor layer to form the active layer pattern comprises:
    performing ashing treatment on the photoresist pattern, to remove the photoresist in the second thickness region, and to thin the photoresist in the first thickness region;
    etching the semiconductor layer, with remaining photoresist in the first thickness region and the etching blocking layer as a mask, to form the active layer pattern; and
    removing the remaining photoresist in the first thickness region.

5. The manufacturing method for the thin film transistor according to claim 1, wherein, a material of the semiconductor layer comprises a metal oxide semiconductor.

6. The manufacturing method for the thin film transistor according to claim 5, wherein, the material includes at least one of IGZO, ZnO, or IZO.

7. The manufacturing method for the thin film transistor according to claim 5, wherein, the modification treatment includes injecting at least one of a tin ion or a titanium ion into the semiconductor layer.

8. The manufacturing method for the thin film transistor according to claim 1, wherein, a material for forming the source electrode and the drain electrode includes at least one of copper, aluminum, or molybdenum.

9. The manufacturing method for the thin film transistor according to claim 1, wherein, after the etching blocking layer is formed, the manufacturing method comprises performing a plasma treatment on the etching blocking layer.

10. The manufacturing method for the thin film transistor according to claim 9, wherein, plasma used in the plasma treatment includes plasma formed by nitrous oxide or plasma formed by oxygen.

11. A manufacturing method for an array substrate, comprising:
   providing a base substrate; and
   forming a thin film transistor on the base substrate, the thin film transistor being manufactured by using the manufacturing method for the thin film transistor according to claim 1.

* * * * *